(12) United States Patent
Andrade de Fonseca

(10) Patent No.: US 10,868,527 B1
(45) Date of Patent: Dec. 15, 2020

(54) SLEW RATE LIMITED DRIVER WITH ACCURATE SLOPE

(71) Applicant: Cadence Design Systems, Inc., San Jose, CA (US)

(72) Inventor: Humberto Andrade de Fonseca, Cirencester (GB)

(73) Assignee: Cadence Design Systems, Inc., San Jose, CA (US)

( * ) Notice: Subject to any disclaimer, the term of this patent is extended or adjusted under 35 U.S.C. 154(b) by 450 days.

(21) Appl. No.: 15/872,743

(22) Filed: Jan. 16, 2018

Related U.S. Application Data

(63) Continuation of application No. 15/843,864, filed on Dec. 15, 2017, now abandoned.

(51) Int. Cl.
| | | |
|---|---|---|
| *H03K 5/05* | (2006.01) | |
| *G05F 3/26* | (2006.01) | |
| *H03K 17/687* | (2006.01) | |

(52) U.S. Cl.
CPC ............... *H03K 5/05* (2013.01); *G05F 3/262* (2013.01); *H03K 17/687* (2013.01)

(58) Field of Classification Search
CPC ......... H03K 5/05; H03K 17/687; G05F 3/262
See application file for complete search history.

(56) References Cited

U.S. PATENT DOCUMENTS

| | | | | |
|---|---|---|---|---|
| 6,144,249 A | * | 11/2000 | Tse ........................... | G05F 3/205 323/316 |
| 2012/0194264 A1 | * | 8/2012 | Chamakura ............. | G05F 3/262 327/538 |

* cited by examiner

*Primary Examiner* — John W Poos
(74) *Attorney, Agent, or Firm* — Schwegman Lundberg & Woessner, P.A.

(57) ABSTRACT

Aspects of the present disclosure address a slew rate controlled driver. The slew rate controlled driver includes an amplifier with a capacitive feedback loop and a current generator capable of producing a current that is proportional to on-chip capacitance. The current generator is implemented using a switched capacitor and supplies the driver with a current that is proportional to the capacitance of the switched capacitor. By supplying the driver with current that is proportional to the capacitance of the switched capacitor, the slope of the output signal of the driver is proportional to the ratio of the switched capacitance and a capacitance of the driver's capacitive feedback loop.

20 Claims, 3 Drawing Sheets

SLEW RATE LIMITED DRIVER WITH ACCURATE SLOPE

CLAIM OF PRIORITY

This application is a continuation of and claims the benefit of priority under 35 U.S.C. § 120 to U.S. patent application Ser. No. 15/843,864, filed on Dec. 15, 2017, which is hereby incorporated by reference herein in its entirety.

TECHNICAL FIELD

The present disclosure generally relates to mechanisms for driving signals across a transmission medium. In particular, the present disclosure addresses a slew rate limited driver with accurate slope.

BACKGROUND

In wired serial communications, certain variations in slew rate may lead to problems with signal transmission. For example, a high slew rate may lead to reflections in the signal transmission that may lead to overshoots/undershoots or electromagnetic interference in other portions of the circuit. As another example, a low slew rate may degrade the noise margin of the signal. Thus, wired serial communication links often use slew rate control on the transmitter side to mitigate the effects of reflections, to reduce electromagnetic interference, and to reduce the effects of overshoots and undershoots when driving inductive loads.

One of the several ways to produce a well-defined slew rate at the output of a transmitter involves using capacitive feedback around a high gain amplifier where the slope produced at the output corresponds to the ratio of current over capacitance (e.g., I/C). However, a drawback of this implementation stems from the fact that typical process variations for on-chip metal capacitors are on the 20% order of magnitude while the creation of current values is tighter than 5%. As a result, the slew rates of drivers implemented using on-chip metal capacitors have a high degree of variation that is typically addressed using complex calibration techniques or additional off-chip components. Other solution use complex loops around the output stage, but suffer from the same intrinsic limitations when it comes to the accuracy over process.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

As noted above, process variations for on-chip metal capacitors create difficulties in implementing slew rate controls for serial communication links that conventionally necessitate complex calibration techniques or additional off-chip components. To address the foregoing issues, among others, aspects of the present disclosure include a slew rate controlled driver that includes a current generator capable of producing a current that is proportional to an on-chip capacitance. In particular, the current generator is implemented using a switched capacitor and supplies the driver with a current that is proportional to the capacitance of the switched capacitor. Because the driver is supplied with current that is proportional to the capacitance of the switched capacitor, the slope of the output signal of the driver is proportional to the ratio of the switched capacitance and a capacitance of the driver's capacitive feedback loop. Although the high tolerance in manufacturing of on-chip capacitors leads to large variations in capacitance values, the relative variation between capacitors on the same chip is relatively low. Thus, by designing the driver such that the slope of the output signal is proportional to a ratio of two on-chip capacitances, the driver is capable of generating signals with very accurate slopes that do not depend on manufacturing tolerances.

Figure 1:
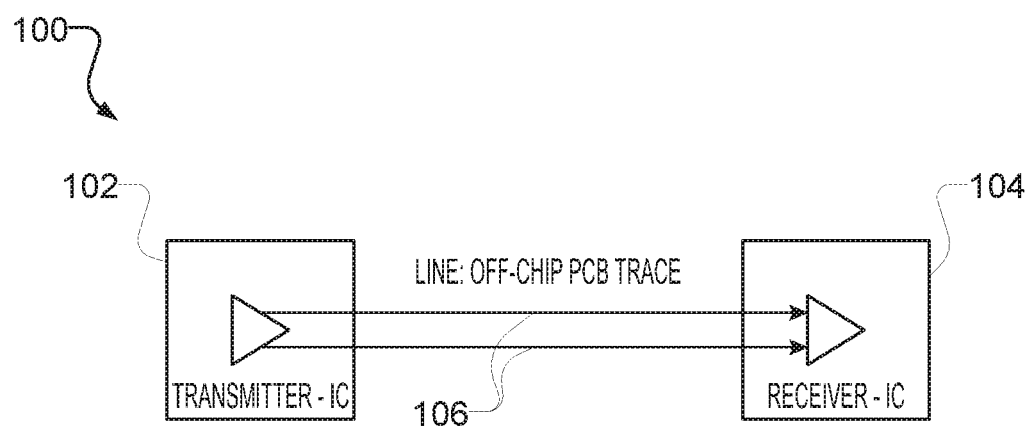
FIG. 1 is a block diagram illustrating a high-level serial communication link comprising a transmitter and a receiver, according to some example embodiments.

With reference to FIG. 1, a wired serial communication link 100 is illustrated. The wired serial communication link 100 comprises a transmitter integrated circuit (IC) 102, a receiver IC 104, and a physical interconnect 106 between the transmitter IC 102 and the receiver IC 104. The transmitter IC 102 transmits data to the receiver IC 104 over the physical interconnect 106 using differential signaling. More specifically, as shown, the physical interconnect 106 comprises two lines, and the transmitter IC 102 transmits binary data to the receiver IC 104 by transmitting alternating high and low signals on each of the lines of the physical interconnect 106.

Figure 2:
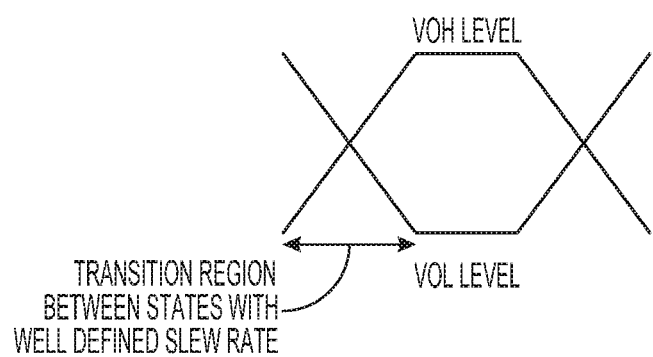
FIG. 2 is a diagram illustrating an example differential waveform output by the transmitter of the serial communication link, according to some example embodiments.

In typical operation, the transmitter IC 102 transmits a high signal on a first line while transmitting a low signal on a second line of the physical interconnect 106. An example of such a differential waveform output by the transmitter IC 102 of the serial communication link 100 is illustrated in FIG. 2, according to some embodiments. In transmitting data over the physical interconnect 106, the transition between high and low signal states is an important design consideration. For example, sharp or instantaneous transitions between high and low signal states may create reflections in the transmission that may result in overshoots and/or undershoots in the line. As another example, sharp or instantaneous transitions may create electromagnetic interference in other portions of the circuit in which the serial communication link 100 may be included. With reference to FIG. 2, the transition between high and low states is represented by the slope of the line between high and low states, which one of ordinary skill in the art would recognize as being the "slew rate" of the transmitter IC 102.

Figure 3:
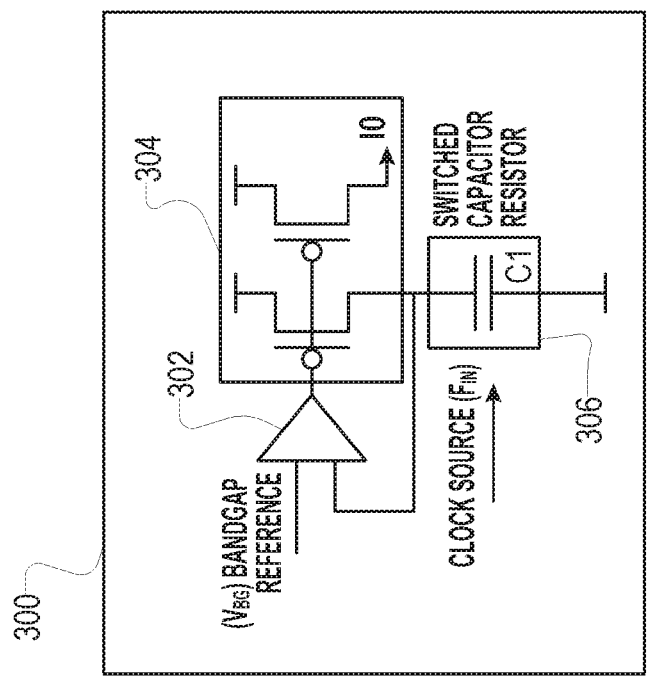
FIG. 3 is a circuit diagram illustrating a switch capacitor current generator for supplying a current that is proportional to capacitance, according to some example embodiments.

FIG. 3 is a circuit diagram illustrating a switch capacitor current generator 300 for supplying a current that is proportional to capacitance, according to some example embodiments. To avoid obscuring the inventive subject matter with unnecessary detail, various functional components that are not germane to conveying an understanding of the inventive subject matter have been omitted from FIG. 3. However, a skilled artisan will readily recognize that various additional functional components may be included in the switched capacitor current generator 300 to facilitate the described functionality or additional functionality that is not specifically described herein.

As shown, the switch capacitor current generator 300 comprises an operational amplifier ("op-amp") 302 having two inputs (e.g., input terminals) and one output (e.g., an output terminal). A voltage reference is connected to and supplies a constant voltage, $V_{BG}$, to one input of the op-amp 302. In some embodiments, the voltage reference corresponds to a bandgap voltage reference. However, it shall be appreciated that the voltage source for the switched capacitor is not limited to a bandgap voltage reference, and that, in other embodiments, other circuits or devices capable of supplying a constant fixed voltage may be utilized. A second input of the op-amp 302 is connected between an input of a current mirror 304 and a terminal of a switched capacitor 306. The output of the op-amp 302 is connected to and supplies voltage to the current mirror 304. The voltage supplied to the current mirror 304 by the op-amp 302 is proportional to the difference between the voltages at the two inputs subject to a gain factor.

The switched capacitor 306 comprises a capacitor with a capacitance of $C_1$ and two switches. The two switches are operable to alternatively connect the capacitor to the two terminals of at a switching frequency, $F_{in}$. In this way, the two switches operate to connect the switch capacitor 306 to the input of the current mirror 304, and the switched capacitor 306 in turn supplies a charge to the input of the current mirror 304 each time it is connected thereby providing a current to the current mirror 304. The switching frequency, $F_{in}$, is based on a clock signal supplied to the switched capacitor 306 by a clock source. Any one of a number of known devices or circuits capable of producing a clock signal may be utilized. In operation, the switched capacitor 306 supplies a charge to the input of the current mirror 304 at the switching frequency $F_{in}$.

As shown, the current mirror 304 comprises two P-type metal-oxide-semiconductor (PMOS) transistors connected at the gates of the two transistors. Although the current mirror 304 is illustrated as being implemented using the two PMOS transistors, it shall be appreciated that the current mirror 304 is not limited to these devices or this configuration, and may be implemented using one of a number of other known configurations of devices for creating a current mirror 304. The current mirror 304 receives current from the switched capacitor 306 at its input (e.g., an input terminal) and duplicates this current to produce a current, $I_O$, at its output (e.g., an output terminal). Given that the current, $I_O$, is a mirror of the current received from the switched capacitor 306, the current, $I_O$, is proportional to the product of $C_1$, $F_{in}$, and $V_{BG}$ (i.e., $F_{in}*V_{BG}*C_1$). The output of the current mirror 304 corresponds to the output of the switch capacitor current generator 300. Hence, the current, $I_O$, generated by the switch capacitor current generator 300 is proportional to on-chip capacitance, namely $C_1$.

Figure 4:
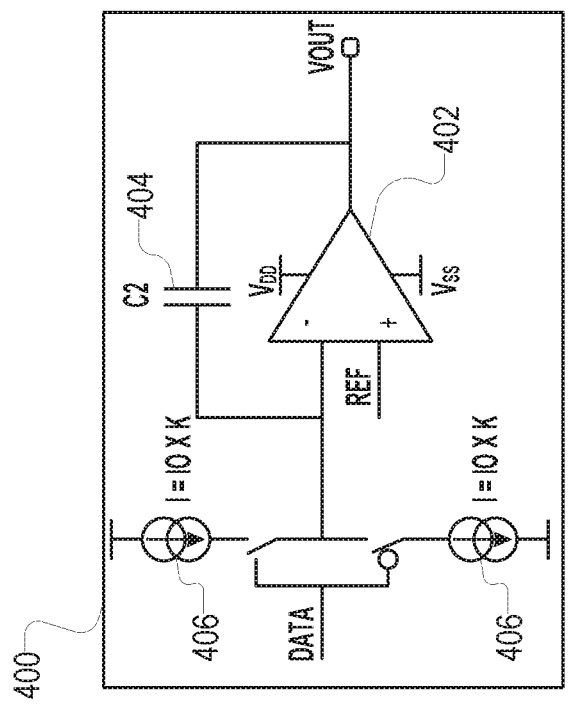
FIG. 4 is a circuit diagram illustrating a slew rate limited driver with accurate slope, according to some example embodiments.

FIG. 4 is a circuit diagram illustrating a slew rate limited driver 400 with accurate slope, according to some example embodiments. To avoid obscuring the inventive subject matter with unnecessary detail, various functional components that are not germane to conveying an understanding of the inventive subject matter have been omitted from FIG. 4. However, a skilled artisan will readily recognize that various additional functional components may be included in the slew rate limited driver 400 to facilitate the described functionality or additional functionality that is not specifically described herein.

The slew rate limited driver 400 receives an input data signal at its input, and provides at output signal based on the input data signal at its output. As shown, the slew rate limited driver 400 comprises a high gain amplifier 402 and a capacitive feedback loop around the high gain amplifier 402 formed by a capacitor 404 with capacitance, $C_2$. More specifically, the capacitive feedback loop is formed by the connection of the capacitor 404 to an input and output of the high gain amplifier 402.

The slew rate limited driver 400 and switched capacitor current generator 300 may be combined into a single device for producing an output signal with an accurate slew rate. In particular, the switched capacitor current generator 300 may be connected to the slew rate limited driver 400 to supply a current to the slew rate limited driver 400 that is proportional to an on-chip capacitance, namely $C_1$.

For example, the high gain amplifier 402 includes two inputs—an inverting input (denoted by "−" in FIG. 4) and a non-inverting input (denoted by "+" in FIG. 4). The non-inverting input is connected to a reference voltage, REF, while the non-inverting input is connected to the input of the slew rate limited driver 400. The non-inverting input receives current I, supplied by one of two mirrored current sources 406 that correspond to the switch capacitor current generator 300. Which of the two current sources 406 supplies current to the high gain amplifier 402 depends on the input data signal received at the input of the slew rate limited driver 400. For example, if the data signal is in a high state (e.g., "1"), a first of the current sources 406 will be connected to the high gain amplifier 402 via a switch and supply current I but, if the data signal is in a low state (e.g., "0"), the second of the current sources 406 will be connected to the high gain amplifier 402 via a switch and supply current I to the high gain amplifier 402.

At the output of the slew rate limited driver 400, the high gain amplifier 402 provides a voltage signal $V_{out}$ with a slew rate (e.g., slope) that is proportional to the ratio of the input current I to the capacitance of $C_2$ (i.e., $I/C_2$). Here, the high gain amplifier 402 receives a current I that is proportional to the current $I_O$ supplied by the current generator 300 subject to a gain factor k. As discussed above, the current $I_O$ is proportional to the product of the capacitance value of $C_1$, the switching frequency $F_{in}$ of $C_1$, and the reference voltage $V_{BG}$ supplied to $C_1$ (i.e., $F_{in}*V_{BG}*C_1$). Thus, the slope of the output voltage signal is proportional to the ratio of the two on-chip capacitances, or more specifically, the slope is proportional to $(F_{in}*V_{BG})*(C_1/C_2)$.

Figure 5A:
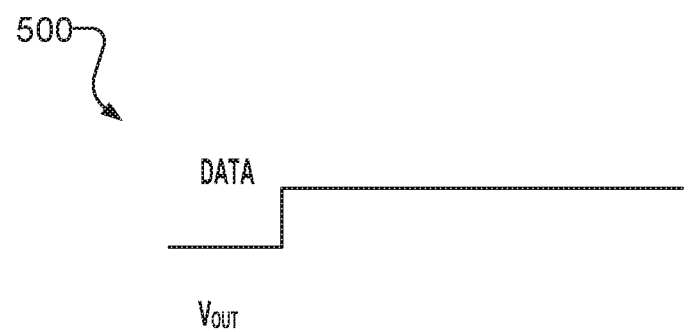
FIG. 5A is a diagram illustrating an example input signal for the slew rate limited driver, according to some example embodiments.
Figure 5B:
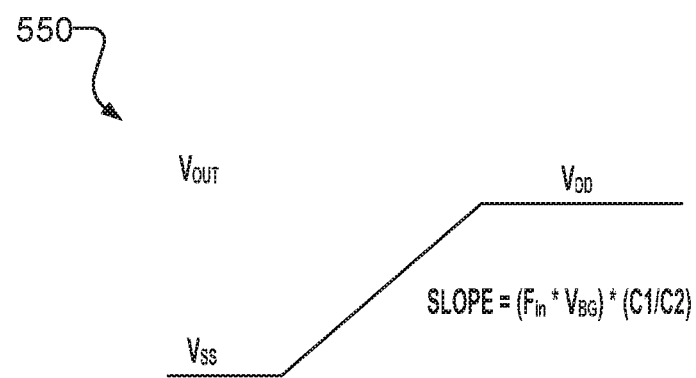
FIG. 5B is a diagram illustrating an output signal produced by the slew rate limited driver based on the example input signal, according to some example embodiments.

FIG. 5A illustrates an example input signal 500 for the slew rate limited driver 400 and FIG. 5B illustrates a corresponding output signal 550 produced by the slew rate limited driver 400 based on the example input signal 500, according to some example embodiments. As shown, the slope, or slew rate, of the output signal 550 is proportional to $(F_{in}*V_{BG})*(C_1/C_2)$, where $F_{in}$ is the switching frequency of switched capacitor 306, $V_{BG}$ is the voltage across the switched capacitor 306, and $C_1/C_2$ is the ratio of the capacitance values of the on-chip metal capacitors 306 and 404. By leveraging the relatively small variation between capacitors on the same chip, the slew rate limited driver 400 is capable of producing an output voltage signal with very accurate slopes.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A device comprising:
a driver having a driver input and a driver output, the driver input operatively receiving an input data signal, the driver comprising:
a high gain amplifier including a first amplifier input, a second amplifier input and an amplifier output, the high gain amplifier providing a voltage signal at the amplifier output based on a difference in voltage between the first amplifier input and the second amplifier input, the first amplifier input being connected to a voltage source, the second amplifier input being connected to the driver input;
a first capacitor connected between the second amplifier input and the amplifier output, the first capacitor creating a capacitive feedback loop between the second amplifier input and the amplifier output; and
a current generator comprising a switched capacitor connected to a current mirror, the current generator being connected to the driver input and supplying a current to the driver that is proportional to a capacitance of the switched capacitor, the current mirror having a current mirror input and a current mirror output, the current mirror providing the current at the current mirror output, the current mirroring an input current received at the current mirror input, the switched capacitor supplying a charge to the current mirror at a switching frequency, the current causing an output signal generated by the device to have a slew rate that is proportional to a ratio of a capacitance of the switched capacitor to a capacitance of the first capacitor.

2. The device of claim 1, wherein the switching frequency is based on a clock signal supplied to the switched capacitor.

3. The device of claim 1, wherein the switched capacitor comprises:
a second capacitor, the capacitance of the second capacitor corresponding to the capacitance of the switched capacitor: and
at least one switch operable to connect the second capacitor to the input terminal of the current mirror at the switching frequency.

4. The device of claim 3, wherein the slew rate of the output signal generated by the driver is proportional to a product of a reference voltage, the switching frequency, and a capacitance ratio of the second capacitor and first capacitor.

5. The device of claim 1, wherein the current mirror comprises two transistors, the two transistors having a connection between gate terminals.

6. The device of claim 1, further comprising a clock source connected to the switched capacitor, the clock source supplying a clock signal to the switched capacitor that corresponds to the switching frequency.

7. The device of claim 1, wherein the current generator further comprises an operational amplifier connected to the current mirror, the operational amplifier configured to provide a voltage source to the current mirror based on a reference voltage.

8. The device of claim 7, wherein the reference voltage corresponds to a bandgap reference voltage.

9. The device of claim 7, wherein the current supplied to the driver is proportional to a product of the capacitance of the switched capacitor, the reference voltage, and the switching frequency.

10. A driver having a driver input and a driver output, the driver input operatively receiving an input data signal, the driver comprising:
a high gain amplifier including a first amplifier input, a second amplifier input and an amplifier output, the high gain amplifier providing a voltage signal at the amplifier output based on a difference in voltage between the first amplifier input and the second amplifier input, the first amplifier input being connected to a voltage source, the second amplifier input being connected to a current generator comprising a switched capacitor connected to a current mirror, the current generator configured to supply a current to the second amplifier input that is proportional to a first capacitance, the current mirror having a current mirror input and a current mirror output, the current mirror providing the current at the current mirror output, the current mirroring an input current received at the current mirror input, the switched capacitor supplying a charge to the current mirror at a switching frequency; and a capacitive feedback loop connected between the second amplifier input and the amplifier output, the capacitive feedback loop having a second capacitance;

the current causing an output signal generated by the driver to have a slew rate that is proportional to a ratio of the first capacitance to the second capacitance.

11. The driver of claim 10, wherein the switching frequency is based on a clock signal supplied to the switched capacitor.

12. The driver of claim 10, wherein the switched capacitor comprises:

a capacitor having the first capacitance: and at least one switch operable to connect the capacitor to the current mirror input at the switching frequency.

13. The driver of claim 10, wherein the slew rate of the output signal generated by the driver is proportional to a product of a reference voltage, the switching frequency, and a capacitance ratio of the second capacitor and first capacitor.

14. The driver of claim 13, wherein the reference voltage corresponds to a bandgap reference voltage connected to the current generator.

15. The driver of claim 13, wherein the current generator further comprises an operational amplifier connected to the current mirror, the operational amplifier providing a voltage source to the current mirror based on the reference voltage.

16. The driver of claim 10, wherein the current generator further comprises a clock source connected to the switched capacitor, the clock source supplying a clock signal to the switched capacitor that corresponds to the switching frequency.

17. The slew rate limited driver of claim 11, wherein the current supplied to the slew rate limited driver is proportional to a product of the first capacitance, a bandgap voltage reference, and the switching frequency.

18. A method comprising:

generating, at a current generator, a current that is proportional to a first on-chip capacitance;

supplying the current to a driver comprising a high gain amplifier with a capacitive feedback loop, the capacitive feedback loop having a second on-chip capacitance, the current being proportional to a product of the first on-chip capacitance, a bandgap voltage reference, and a switching frequency; and generating, at the driver, an output signal based on the current, the output signal having a slew rate that is proportional to a ratio of the first on-chip capacitance to the second on-chip capacitance.

19. The method of claim 18, wherein, the switching frequency corresponds to a clock signal supplied by a clock source connected to the current generator.

20. The method of claim 18, wherein the slew rate is proportional to a product of the ratio of the first on-chip capacitance to the second on-chip capacitance, the bandgap voltage reference, and the switching frequency.

\* \* \* \* \*